(12) United States Patent
Lee et al.

(10) Patent No.: US 8,520,423 B2
(45) Date of Patent: Aug. 27, 2013

(54) NON-VOLATILE MEMORY DEVICE

(75) Inventors: Hyun Joo Lee, Yongin (KR); Dong Keun Kim, Icheon (KR)

(73) Assignee: Hynix Semiconductor Inc., Icheon (KR)

( * ) Notice: Subject to any disclaimer, the term of this patent is extended or adjusted under 35 U.S.C. 154(b) by 294 days.

(21) Appl. No.: 12/962,322

(22) Filed: Dec. 7, 2010

(65) Prior Publication Data

US 2012/0051114 A1    Mar. 1, 2012

(30) Foreign Application Priority Data

Aug. 30, 2010    (KR) .................. 10-2010-0084015

(51) Int. Cl.
*G11C 11/00*        (2006.01)
(52) U.S. Cl.
USPC .......................................................... 365/148
(58) Field of Classification Search
USPC .......................................................... 365/148
See application file for complete search history.

(56) References Cited

U.S. PATENT DOCUMENTS

| 5,886,546 | A  | * | 3/1999  | Hwang ........................ 327/103 |
| 6,191,979 | B1 | * | 2/2001  | Uekubo .................. 365/185.25 |
| 2005/0207203 | A1 |  | 9/2005  | Kang |
| 2005/0248974 | A1 |  | 11/2005 | Kang |
| 2010/0085826 | A1 | * | 4/2010  | Kang et al. .................... 365/201 |
| 2012/0140574 | A1 | * | 6/2012  | Lee et al. ................. 365/189.06 |

FOREIGN PATENT DOCUMENTS

| KR | 1020050094123 A | 9/2005  |
| KR | 1020050106222 A | 11/2005 |
| KR | 1020080101989 A | 11/2008 |

\* cited by examiner

*Primary Examiner* — Hoai V Ho
*Assistant Examiner* — Pablo Huerta

(57) ABSTRACT

A non-volatile memory device for performing a sensing operation using a current signal includes a cell array, a current-voltage converter, and a sense amplifier. The cell array includes at least one unit cell so as to read or write data. The current-voltage converter converts a sensing current corresponding to data stored in the unit cell into a sensing voltage, outputs the sensing voltage, receives a feedback input of the sensing voltage, and adjusts a level of a current applied to an input terminal of the sensing current in response to a level of the feedback input sensing voltage. The sense amplifier compares the sensing voltage with a predetermined reference voltage, and amplifies the result of comparison.

20 Claims, 10 Drawing Sheets

NON-VOLATILE MEMORY DEVICE

CROSS-REFERENCE TO RELATED APPLICATION

The priority of Korean patent application No. 10-2010-0084015 filed on Aug. 30, 2010, the disclosure of which is hereby incorporated in its entirety by reference, is claimed.

BACKGROUND OF THE INVENTION

Embodiments of the present invention relate to a non-volatile memory device, and more specifically, to a phase change memory device for performing a sensing operation using a current signal.

Memory devices can be classified into a volatile memory device and a non-volatile memory device. The non-volatile memory device includes a non-volatile memory cell capable of preserving stored data even when not powered. For example, the non-volatile memory device may be implemented as a flash random access memory (flash RAM), a phase change random access memory (PCRAM), or the like.

The PCRAM includes a memory cell that is implemented using a phase change material such as germanium antimony tellurium (GST), wherein the GST changes to a crystalline phase or an amorphous phase if heat is applied to the GST, thereby storing data in the memory cell.

A non-volatile memory device (e.g., a magnetic memory, a phase change memory (PCM), or the like) has a data processing speed similar to that of a volatile RAM device. The non-volatile memory device also preserves data even when power is turned off.

FIGS. 1A and 1B illustrate a conventional phase change resistor (PCR) element 4.

Referring to FIGS. 1A and 1B, the PCR element 4 includes a top electrode 1, a bottom electrode 3, and a phase change material (PCM) layer 2 located between the top electrode 1 and the bottom electrode 3. If a voltage and a current are applied to the top electrode 1 and the bottom electrode 3, a current signal is provide to the PCM layer 2, and a high temperature is induced in the PCM layer 2, such that an electrical conductive status of the PCM layer 2 changes depending on resistance variation.

FIGS. 2A and 2B illustrate a phase change principle of the conventional PCR element 4.

Referring to FIG. 2A, if a low current smaller than a threshold value flows in the PCR element 4, the PCM layer 2 has a temperature suitable for a crystalline phase. Therefore, the PCM layer 2 changes to the crystalline phase, which is a low-resistance phase material. As a result, a current may flow between the top electrode 1 and the bottom electrode 3.

On the other hand, as shown in FIG. 2B, if a high current greater than the threshold value flows in the PCR element 4, the PCM layer 2 has a temperature higher than a melting point. Therefore, the PCM layer 2 changes to an amorphous phase, which is a high-resistance phase material. As a result, it is difficult for the current to flow between the top electrode 1 and the bottom electrode 3.

As described above, the PCR element 4 can store data corresponding to two resistance phases as non-volatile data. For example, if the PCR element 4 has a low-resistance phase set to data '1' and the PCR element 4 has a high-resistance phase set to data '0', the PCR element 4 may store two logic states for data.

In addition, a phase of the PCM layer (i.e., a phase change resistive material) 2 is not changed although the phase change memory device is powered off, such that the aforementioned data can be stored as non-volatile data.

FIG. 3 illustrates a write operation of a conventional PCR cell.

Referring to FIG. 3, when a current flows between the top electrode 1 and the bottom electrode 3 of the PCR element 4 for a predetermined time, heat is generated.

Assuming that a low current smaller than a threshold value flows in the PCR element 4 during the predetermined time, the PCM layer 2 has the crystalline phase formed by a low-temperature heating state, such that the PCR element 4 becomes a low-resistance element having a set state.

Otherwise, assuming that a high current greater than the threshold value flows in the PCR element 4 during the predetermined time, the PCM layer 2 has the amorphous phase formed by a high-temperature heating state, such that the PCR element 4 becomes a high-resistance element having a reset state.

By means of the aforementioned properties, in order to write data of the set state during the write operation, a low voltage is applied to the PCR element 4 for a long period of time. On the other hand, in order to write data of the reset state during the write operation, a high voltage is input to the PCR element 4 for a short period of time.

The PCR memory device outputs a sensing current to the PCR element 4 during a sensing operation, such that it can sense data written in the PCR element 4.

BRIEF SUMMARY OF THE INVENTION

Various embodiments of the present invention are directed to providing a non-volatile memory device that substantially obviates one or more problems due to limitations and disadvantages of the related art.

An embodiment of the present invention relates to a non-volatile memory device capable of increasing a sensing margin required for a read operation by improving a structure of a current-to-voltage converter, resulting in a reduced sensing time.

An embodiment of the present invention relates to a non-volatile memory device capable of reducing the generation of an abnormal read operation caused by resistance variation.

In accordance with one embodiment of the present invention, the non-volatile memory device includes a cell array having a plurality of unit cells configured to store data; a current-voltage converter configured to convert a sensing current corresponding to data stored in a unit cell in the cell array into a sensing voltage, output the sensing voltage, receive a feedback input of the sensing voltage, and adjust a level of a current applied to an input terminal of the sensing current in response to a level of the feedback input sensing voltage; and a sense amplifier configured to compare the sensing voltage with a reference voltage, and amplify a result of comparison.

In accordance with another embodiment of the present invention, the non-volatile memory device includes a cell array including a plurality of unit cells to store data; a clamping unit configured to clamp a sensing current sensed from a unit cell in the cell array in response to a clamping control signal; a driving circuit configured to convert the sensing current into a sensing voltage in response to a precharge signal and a current driving signal; and a feedback circuit configured to adjust a level of the sensing current in response to the sensing voltage and the precharge signal.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 1A:
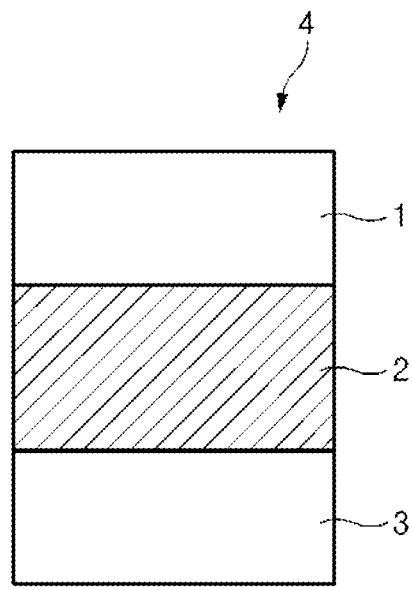
FIGS. 1A and 1B illustrate a conventional phase change resistor (PCR) element.
Figure 1B:
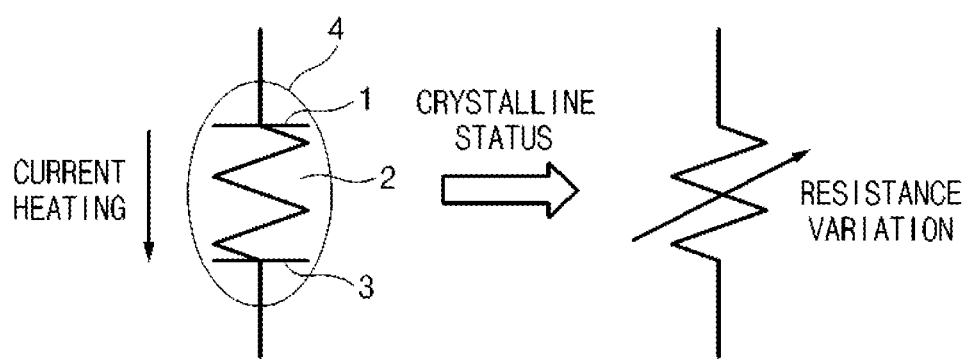
Figure 2A:
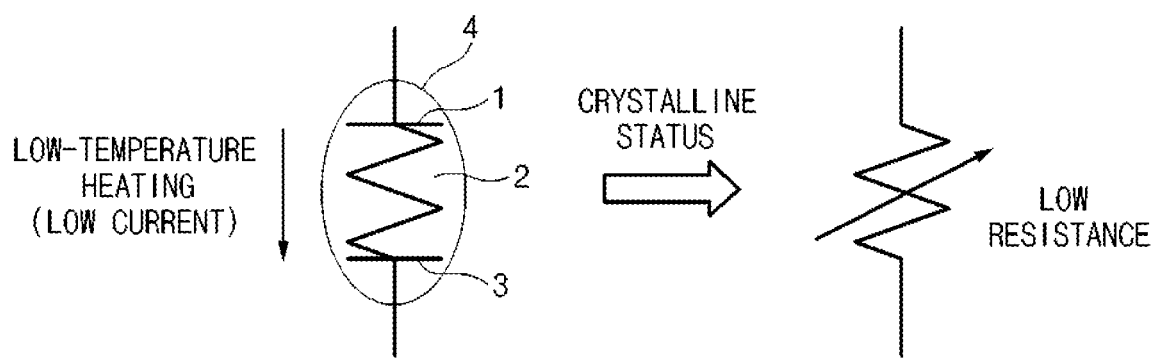
FIGS. 2A and 2B illustrate the principles of data storage in a conventional PCR element.
Figure 2B:
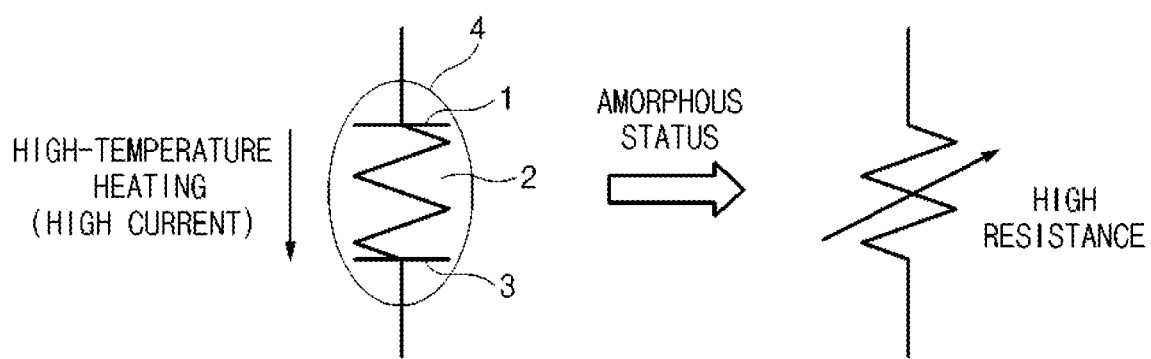
Figure 3:
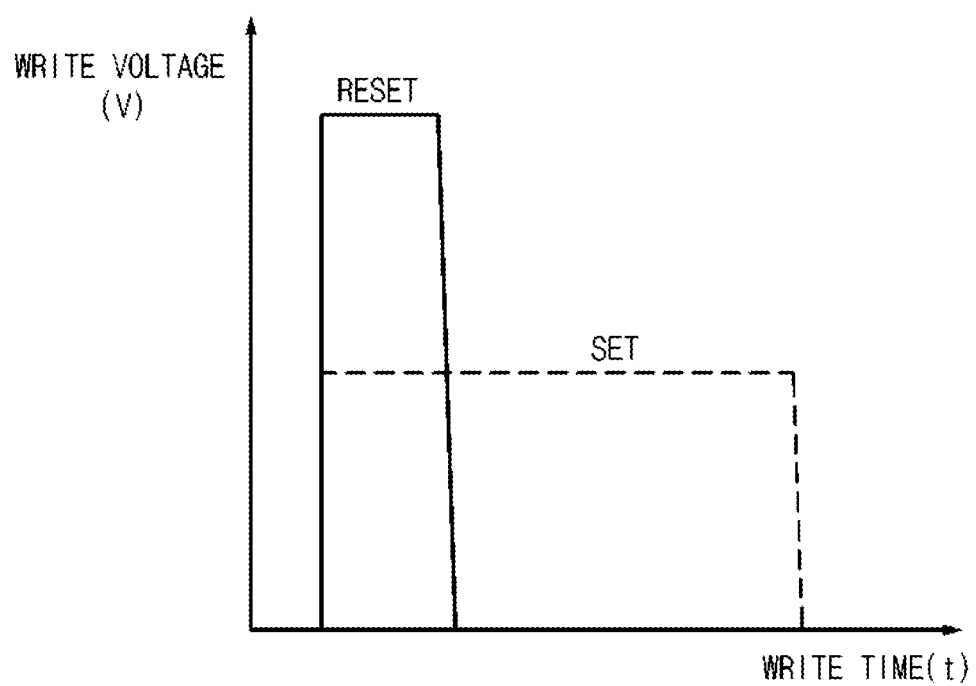
FIG. 3 illustrates a write operation of a conventional PCR cell.
Figure 4:
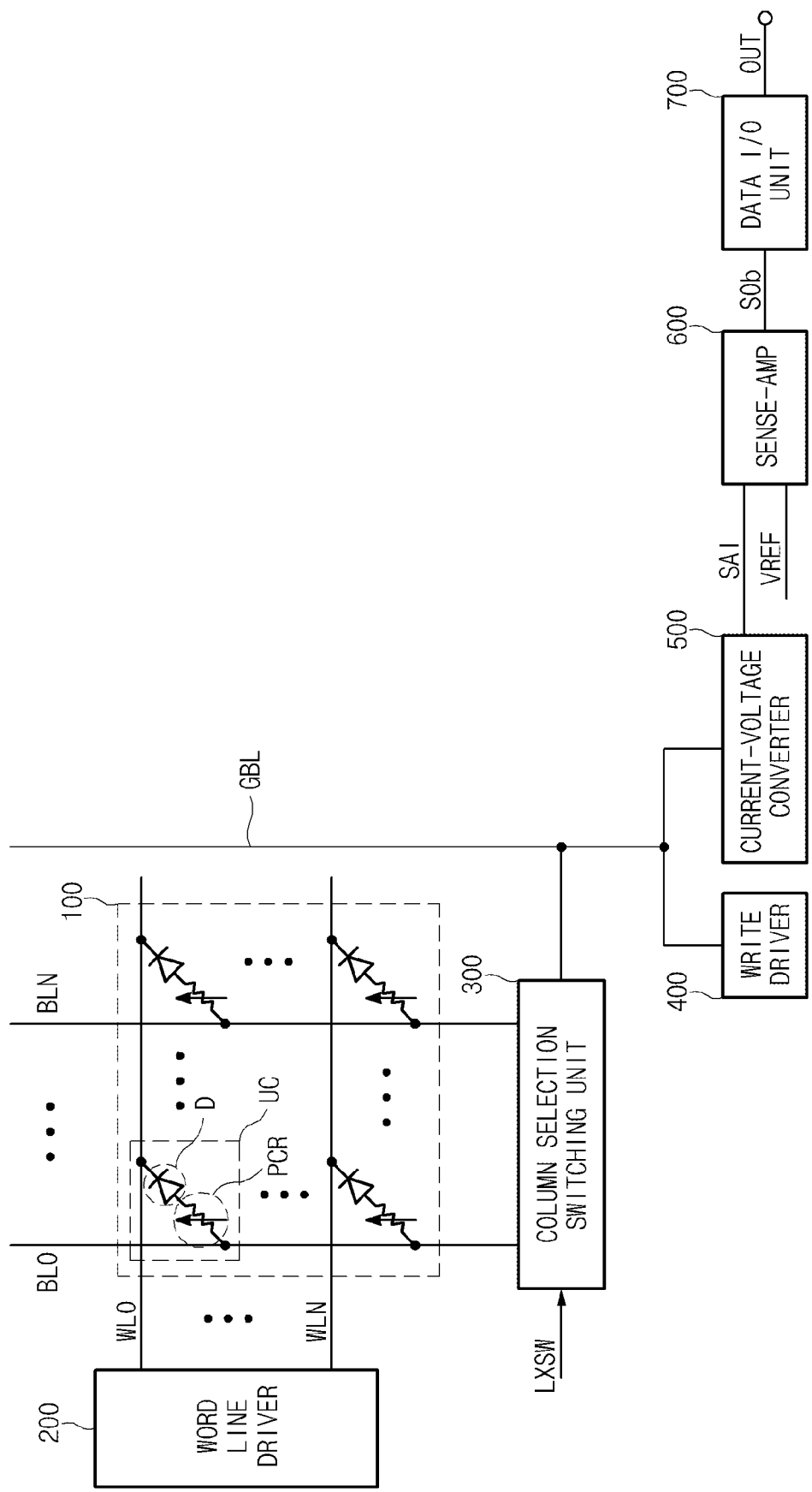
FIG. 4 illustrates a non-volatile memory device according to an embodiment of the present invention.

FIG. 4 illustrates a non-volatile memory device according to an embodiment of the present invention.

Referring to FIG. 4, the non-volatile memory device includes a cell array 100, a word line driver 200, a column selection switching unit 300, a write driver 400, a current-voltage converter 500, a sense amplifier (sense-amp) 600, and a data input/output (I/O) unit 700.

The cell array 100 includes a plurality of unit cells (UCs). Each unit cell UC is located at an intersection area between a bit line BL and a word line WL. Each unit cell UC includes a memory element and a switching element, and data is stored in the memory element.

Herein, the memory element may be any one of various non-volatile memory elements including a ferroelectric capacitor, a phase change memory element, a spin torque transfer (STT) element, a magneto-resistive element, and the like.

In accordance with the embodiment of the present invention, each unit cell UC contained in the cell array 100 may include a phase change resistor (PCR) as the memory element.

Referring to FIG. 4, the non-volatile memory element includes a PCR, and the switching element includes a diode D for convenience of description and better understanding of the present invention. However, the scope and type of the non-volatile memory element and the switching element are not limited thereto, and may be applied to other examples as necessary.

The PCR is connected between the bit line BL and the diode D such that it stores data therein. A resistance value of the PCR changes depending on the stored data.

The switching element may be set to a diode D capable of reducing a cell area. The diode D is connected between the PCR and the word line WL. The diode D enables a current to flow in a forward direction and prevents the current from flowing in a reverse direction. In the phase change memory device according to the embodiment of the present invention, the direction from the bit line BL to the word line WL may be set to the forward direction as an example.

The cell array 100 is connected to the column selection switching unit 300 through bit lines BL0~BLN, and to the word line driver 200 through word lines WL0~WLN, N being a positive integer.

When the word line driver 200 performs a sensing operation for one or more unit cells UCs, a word line WL connected to a corresponding unit cell UC is activated. The word line driver 200 provides a low-level voltage to the word line WL so as to activate the word line WL.

For example, if the sensing operation for unit cells UCs connected to word lines WL0 and WL1 is performed, the word line driver 200 activates the word lines WL0 and WL1 and deactivates other word lines WL2~WLN.

The column selection switching unit 300 selects one of the plurality of bit lines BL0~BLN in response to a column selection signal LXSW. The bit line BL selected by the column selection signal LXSW is connected to a global bit line GBL.

The write driver 400 generates a driving voltage corresponding to input data during a write operation, and outputs the driving voltage to the cell array 100 through the global bit line GBL and the column selection switching unit 300.

If the word line driver 200 drives the word line WL with a low-level voltage, the write driver 400 outputs the driving voltage to the unit cell UC through the bit lines BL0~BLN. In this case, because the bit line BL has a voltage level higher than that of the word line WL, a forward current flows in the switching element contained in the unit cell UC.

As a result, current flows in the PCR and a voltage proportional to a resistance value is applied to both ends of the PCR. The current-voltage converter 500 and the sense amplifier 600 sense a value of a current applied to both ends of the PCR, thereby generating a sensing voltage SAI.

In this case, when the forward current flows in the PCR, the change in the current passing through the PCR is inversely proportional to the resistance of the PCR.

The current-voltage converter 500 converts a cell-sensing current flowing in the global bit line GBL into a voltage, such that it outputs the sensing voltage SAI. The non-volatile memory device for sensing data by reading current variation requires the current-voltage converter 500.

The sense amplifier 600 compares the sensing voltage SAI with a reference voltage VREF, amplifies a difference between the sensing voltage SAI and the reference voltage VREF, and thus outputs sensing data SOb.

The data I/O unit 700 stores the sensing data SOb generated from the sense amplifier 600 for a predetermined period of time, and then outputs an output signal OUT.

The data I/O unit 700 may include a latch circuit. In this case, the sensing data SOb output from the sense amplifier 600 is latched in the latch circuit for the predetermined period of time, and then output.

Figure 5:
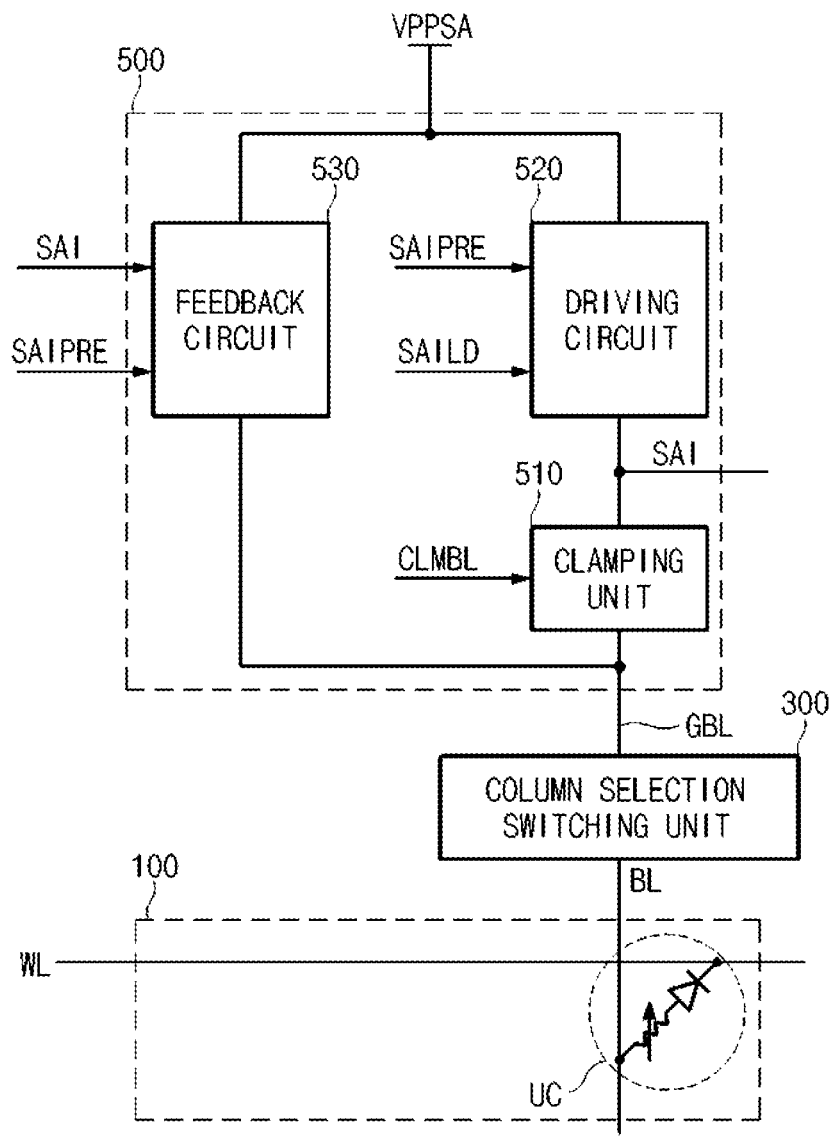
FIG. 5 is a detailed block diagram illustrating a current-voltage converter shown in FIG. 4 according to an embodiment of the present invention.

FIG. 5 is a detailed block diagram illustrating the current-voltage converter 500 shown in FIG. 4.

Referring to FIG. 5, the current-voltage converter 500 includes a clamping unit 510, a driving circuit 520 and a feedback circuit 530.

Although the cell array 100 includes a plurality of unit cells (UCs), FIG. 5 illustrates only one bit line BL crossed with one word line WL and a unit cell UC formed at an intersection area between the bit line BL and the word line WL for convenience of description.

Herein, the unit cell UC includes a non-volatile memory element. For example, as shown in FIG. 5, the unit cell UC may include a PCR.

The clamping unit 510 clamps a voltage level of a sensing voltage SAI received from a global bit line GBL in response to a clamping control signal CLMBL during a sensing operation.

The driving circuit 520 drives a high voltage VPPSA in response to a precharge signal SAIPRE and a current driving signal SAILD, such that it outputs the sensing voltage SAI.

The feedback circuit 530 receives a feedback result of the sensing voltage SAI output from the driving circuit 520 as an input signal. The feedback circuit 530 provides the high voltage VPPSA to the global bit line GBL in response to the feedback sensing voltage SAI and the precharge signal SAIPRE. In this case, the feedback circuit 530 is activated when the sensing operation is performed, and drives the sensing voltage SAI in response to a level of the high voltage VPPSA.

Figure 6:
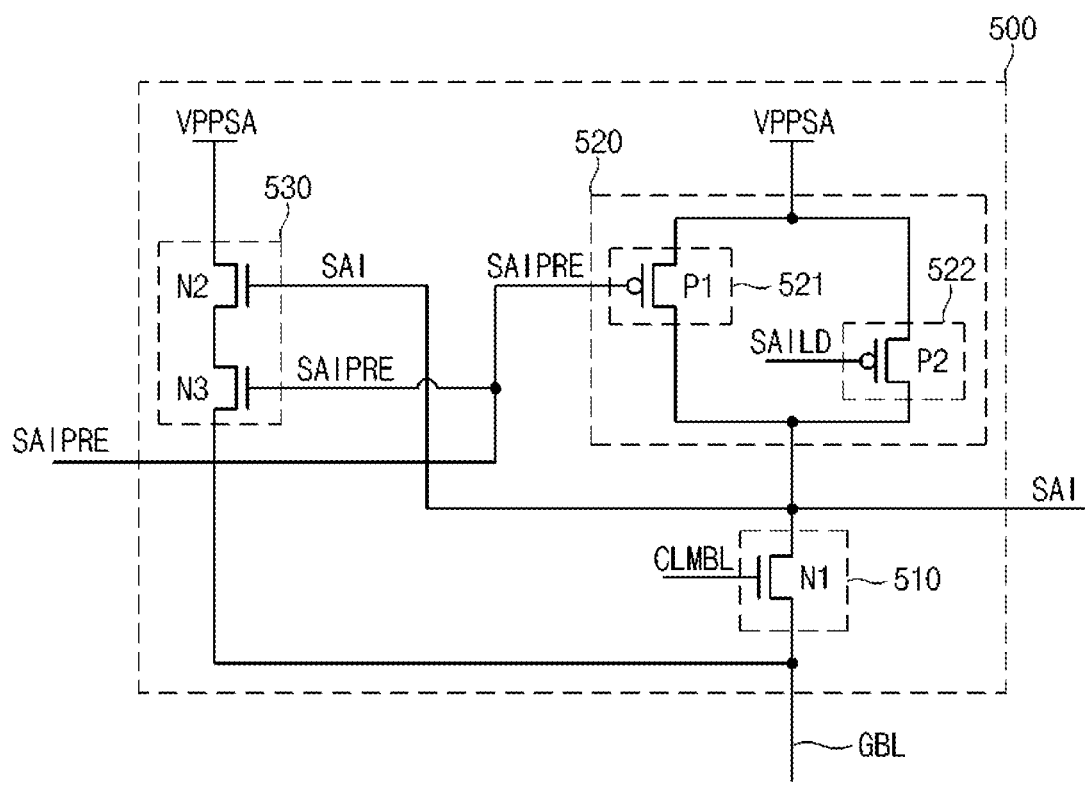
FIG. 6 is a detailed circuit diagram illustrating the current-voltage converter shown in FIG. 5 according to an embodiment of the present invention.

FIG. 6 is a detailed circuit diagram illustrating the current-voltage converter 500 shown in FIG. 5 according to an embodiment of the present invention.

Referring to FIG. 6, the clamping unit 510 may include a switching element connected between the bit line GBL and the driving circuit 520 and be selectively driven by the clamping control signal CLMBL. In this case, the switching element may include an NMOS transistor N1.

The NMOS transistor N1 includes a drain terminal connected to the driving circuit 520, a gate terminal receiving the clamping control signal CLMBL, and a source terminal connected to the unit cell UC through the global bit line GBL.

For example, in the case of the sensing operation, if the clamping control signal CLMBL of a high level is input to the clamping unit 510, the NMOS transistor N1 in the clamping unit 510 is turned on, such that the level of the sensing voltage SAI received from the global bit line GBL is clamped by the clamping unit 510. In contrast, under the condition that the sensing operation is not performed, if the clamping control signal CLMBL of a low level is input to the clamping unit 510, the clamping unit 510 is deactivated so that it does not output the sensing voltage SAI.

The driving circuit 520 includes a precharge unit 521 and a current adjusting unit 522.

Herein, the precharge unit 521 precharges the sensing voltage SAI with a high voltage (VPPSA) level in response to the precharge signal SAIPRE.

In this case, the precharge unit 521 includes a PMOS transistor P1 that is connected between a high voltage (VPPSA) input terminal and a sensing voltage (SAI) output terminal and receives the precharge signal SAIPRE through a gate terminal.

In other words, when the precharge signal SAIPRE is activated, the precharge unit 521 precharges the sensing voltage SAI with the VPPSA level through the PMOS transistor P1 turned on by activation of the precharge signal SAIPRE before the sensing voltage SAI is output. The precharge signal SAIPRE goes to a low level during a precharge operation such that the low-level precharge signal SAIPRE is input to the precharge unit 521. During the sensing operation, the precharge signal SAIPRE goes to a high level such that the high-level precharge signal SAIPRE is input to the precharge unit 521.

The current adjusting unit 522 adjusts the amount of sensing current flowing to the sensing voltage output terminal in response to the current driving signal SAILD, such that it controls the level of the sensing voltage SAI.

In this case, the current adjusting unit 522 includes a PMOS transistor P2 that is connected between the VPPSA input terminal and the SAI output terminal and receives the current driving signal SAILD through a gate terminal. The current driving signal SAILD goes to a low level during the sensing operation and is input to the current adjusting unit 522. During the remaining operations (other than the sensing operation), the current driving signal SAILD goes to a high level and is input to the current adjusting unit 522.

The feedback circuit 530 receives the sensing voltage SAI output from the driving circuit 520 as an input signal. The feedback circuit 530 drives the high voltage VPPSA in response to the sensing voltage SAI and the precharge signal SAIPRE.

In this case, the feedback circuit 530 is connected between the VPPSA input terminal and the global bit line GBL, and includes a switching element for receiving the sensing voltage SAI and a driving element for receiving the precharge signal SAIPRE.

For example, the switching element and the driving element may include NMOS transistors N2 and N3, respectively, and connected to each other in series.

If the sensing voltage SAI goes to a high level and is fed back to the NMOS transistor N2, the NMOS transistor N2 is turned on to drive the high voltage VPPSA. The operation for inputting the high-level sensing voltage SAI to the NMOS transistor N2 indicates the execution of the sensing operation. Therefore, the NMOS transistor N2 drives the high voltage VPPSA during the sensing operation.

On the other hand, if the sensing voltage SAI goes to a low level and is fed back to the NMOS transistor N2, the NMOS transistor N2 is turned off so that the high voltage VPPSA is not driven. The operation for inputting the low-level sensing voltage SAI to the NMOS transistor N2 indicates that the sensing operation is not performed. Therefore, the NMOS transistor N2 does not drive the high voltage VPPSA when the sensing operation is not performed.

If the precharge signal SAIPRE goes to a low level and is input to the NMOS transistor N3 during the precharge operation, the NMOS transistor N3 is turned off so that it does not provide the high voltage VPPSA to the global bit line GBL. Therefore, the NMOS transistor N3 does not drive the high voltage VPPSA while the precharge operation is performed.

On the other hand, if the precharge signal SAIPRE goes to a high level and is input to the NMOS transistor N3 during the sensing operation, the NMOS transistor N3 is turned on so that it provides the high voltage VPPSA to the global bit line GBL. Therefore, the NMOS transistor N3 allows the feedback circuit 530 to be operated only within a predetermined time interval in which the sensing operation is performed, resulting in reducing unnecessary power consumption.

Figure 7:
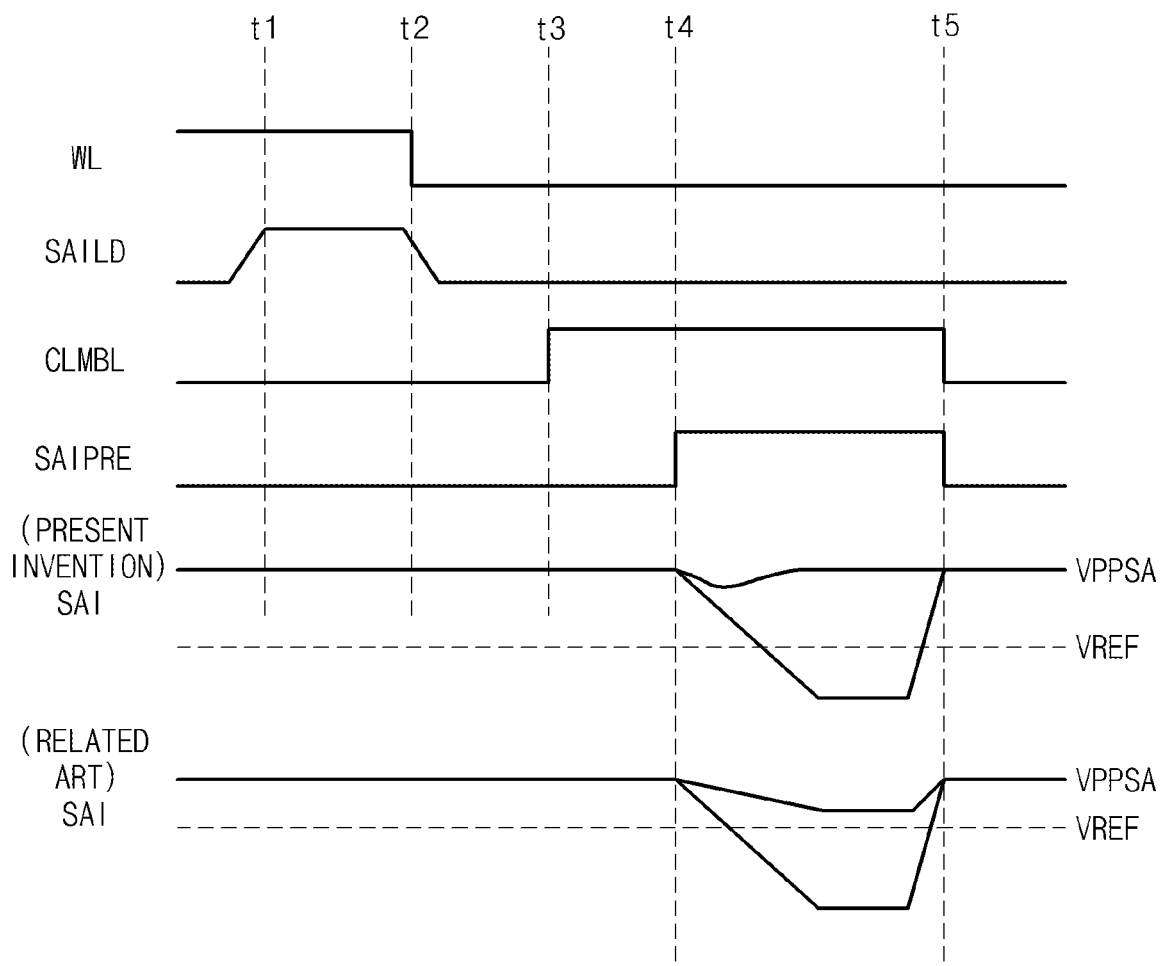
FIG. 7 is a timing diagram illustrating operation of the current-voltage converter shown in FIG. 4 according to an embodiment of the present invention.

FIG. 7 is a timing diagram illustrating an operation of the current-voltage converter 500 according to an embodiment of the present invention. The operation of the current-voltage converter 500 will hereinafter be described with reference to FIG. 7.

Referring to FIG. 7, after a time point t1, a word line WL maintains a high level, and the precharge signal SAIPRE maintains a low level. Therefore, the PMOS transistor P1 is turned on so that the sensing voltage SAI is precharged with a high voltage VPPSA.

In addition, the current driving signal SAILD goes to a high level, and the clamping control signal CLMBL maintains a low level. As a result, the PMOS transistor P2 and the NMOS transistor N1 are turned off.

After that, at a time point t2, the word line WL transitions from a high level to a low level in response to an operation of the word line driver 200. That is, the word line driver 200 drives the word line WL with a high level indicating a deactivation status at the time point t1, and then drives the word line WL with a low level indicating an activation status from the time point t2.

At the time point t2, the current driving signal SAILD transitions to a low level. Therefore, the PMOS transistor P2 is turned on so that the sensing voltage SAI maintains a VPPSA level.

In other words, from the time point t2, the word line driver 200 drives the word line WL with a low level, and the sensing voltage SAI is driven with a VPPSA level by the driving circuit 520, such that the sensing operation can be prepared.

Subsequently, the clamping control signal CLMBL transitions from a low level to a high level at a time point t3. If the clamping control signal CLMBL goes to a high level and is input to the clamping unit 510, the NMOS transistor N1 of the clamping unit 510 is turned on so that it clamps a voltage level of the sensing voltage SAI.

As described above, the reason why a predetermined time period is required between two time points t2 and t3 is to make the clamping unit 510 control an operation timing in consideration of a predetermined time elapsed for the current driving circuit 520 to drive the high voltage VPPSA. The clamping unit 510 controls the timing for transmitting the driven high voltage VPPSA, such that the current-voltage converter 500 can more accurately perform the sensing operation.

Next, the precharge signal SAIPRE transitions from a low level to a high level at a time point t4.

If the PMOS transistor P1 is turned off when the precharge signal SAIPRE goes to a high level, the precharge operation is terminated, and the sensing voltage SAI is not precharged any longer.

In the meantime, if the precharge signal SAIPRE goes to a high level at the time point t4 so that the precharge operation is completed, the NMOS transistor N3 is turned on by the execution of the sensing operation, so that the high voltage VPPSA is provided to the global bit line GBL.

During the precharge operation, the driving circuit 520 drives the sensing voltage SAI with the high voltage VPPSA. During the sensing operation, the feedback circuit 530 performs an operation for driving the sensing voltage SAI with the high voltage VPPSA.

If the sensing operation begins at the time point t4, a predetermined voltage is input to both ends of a non-volatile memory element (e.g., a phase change resistor) contained in the unit cell UC. Thus, the sensing voltage SAI is changed in response to a difference in resistance of the cell data. The difference in resistance of the cell data is called a sensing margin. If the sensing voltage SAI is not significantly changed, i.e., a sufficient sensing margin is not guaranteed, it is impossible for the sense amplifier 600 to correctly identify data.

Since the related art does not include the feedback circuit 530 in the current-voltage converter 500, there is a small difference in an output voltage depending on cell data at the beginning of the sensing operation of the current-voltage converter 500. That is, when performing a read operation on data in a high-resistance state, a voltage drop occurs in the current adjusting unit 522 in which a sensing current flows by the PMOS transistor P2 contained in the current adjusting unit 522.

Therefore, the level of the sensing voltage SAI becomes close to that of the reference voltage VREF, so that the sensing margin is also gradually reduced, and resistance variation unavoidably occurs in the unit cell UC. As a result, the possibility of a failed read operation is increased. Meanwhile, if a reading time is additionally guaranteed to secure the sensing margin, an overall sensing time is increased.

However, in accordance with an embodiment of the present invention, the current-voltage converter 500 controls the driving circuit 520 to drive the sensing voltage SAI with the high voltage VPPSA during a sensing-operation execution period between two time points t4 and t5, and controls the sensing voltage SAI to be fed back to the feedback circuit 530.

As a result, the sensing voltage SAI is additionally pulled up by the high voltage VPPSA supplied from the feedback circuit 530. That is, although the driving circuit 520 does not sufficiently provide the high voltage VPPSA, and thus the sensing margin is reduced, the feedback circuit 530 contained in the current-voltage converter 500 additionally provides the high voltage VPPSA, so that the current-voltage converter 500 can guarantee a sufficient sensing margin.

Subsequently, if the precharge signal SAIPRE transitions from a high level to a low level at a time point t5, the driving circuit 520 stops the sensing operation and performs the precharge operation. In addition, the feedback circuit 530 stops the driving operation.

Figure 8A:
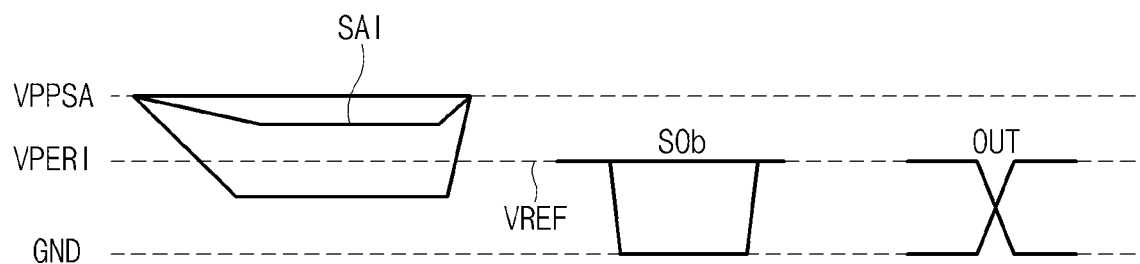
FIGS. 8A and 8B are timing diagrams illustrating results of comparison between a read voltage level of the present invention and that of the related art.
Figure 8B:
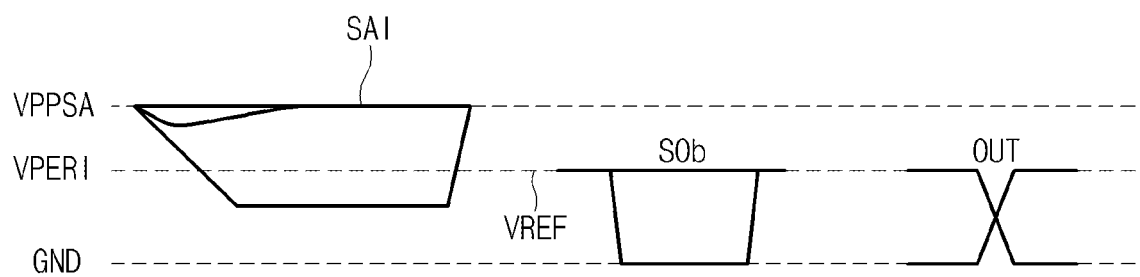

FIGS. 8A and 8B are timing diagrams illustrating results of comparing sensing voltage (SAI) levels of the present invention and the related art.

Referring to FIGS. 8A and 8B, when a diode-type switching element is used in a unit cell UC, a high voltage is required for a read operation due to a high threshold voltage of the diode-type switching element. For this operation, the current-voltage converter 500 uses a voltage VPPSA higher than a peri-voltage VPERI used for the read operation. The peri-voltage VPERI generally has an external input voltage level used for a general peripheral circuit. Therefore, the sensing voltage SAI is driven with the high voltage VPPSA higher than the peri-voltage VPERI.

In the related art shown in FIG. 8A, the sensing voltage SAI is reduced close to a reference voltage (VREF) level, resulting in a reduced read margin.

On the other hand, in accordance with an embodiment of the present invention, the current-voltage converter 500 for primarily amplifying cell data further includes the feedback circuit 530, resulting in increased amplification efficiency. In this case, the feedback circuit 530 operates only when the sensing voltage SAI is in a high level.

In other words, if the sensing voltage SAI goes to a high level, the high-level sensing voltage SAI indicates that high-resistance reset data is read from the unit cell UC. In accordance with the embodiment of the present invention, the NMOS transistor N2 is turned on at the reset-data read condition in which the sensing voltage SAI is in a high level, so that the global bit line GBL is pulled up to a high voltage (VPPSA) level. Therefore, the level of the sensing voltage SAI is increased as shown in FIG. 8B, such that the read operation margin can be guaranteed.

In FIG. 8B, the sense amplifier 600 senses the sensing voltage SAI using the reference voltage VREF, amplifies the sensing data SOb to a peri-voltage (VPERI) level or a ground voltage (GND) level, and outputs the amplified sensing data SOb. In this case, when the current-voltage converter 500 located ahead of the sense amplifier 600 reads high-resistance read data, the sensing voltage SAI is output at the VPPSA level, such that the operation margin of the sense amplifier 600 is increased. In addition, an output signal OUT of the data I/O unit 700 is output at the VPERI level.

Figure 9:
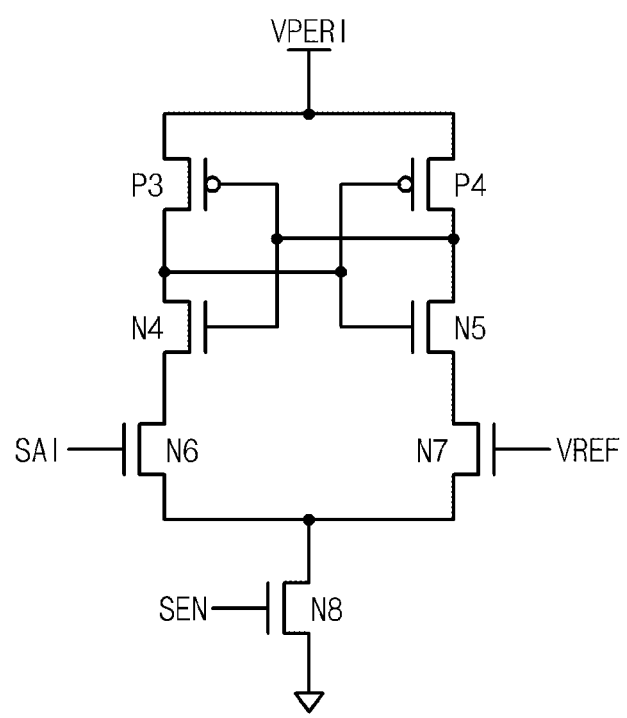
FIG. 9 is a detailed circuit diagram illustrating a sense amplifier shown in FIG. 4 according to one embodiment of the present invention.

FIG. 9 is a detailed circuit diagram illustrating the sense amplifier 600 shown in FIG. 4 according to one embodiment of the present invention.

Referring to FIG. 9, the sense amplifier 600 includes PMOS transistors P3 and P4 and a plurality of NMOS transistors N4~N8. In this case, the PMOS transistors P3 and P4 are cross-coupled to the NMOS transistors N4 and N5, and each of the PMOS and NMOS transistors P3, P4, N4 and N5 are driven with the VPERI level.

In addition, the NMOS transistor N6 receives the sensing voltage SAI through its own gate terminal, and the NMOS transistor N7 receives the reference voltage VREF through its own gate terminal. The sensing voltage SAI and the reference voltage VREF are compared with each other, and the result of the comparison is amplified. The NMOS transistor N8 is connected between a common source terminal of the NMOS transistors N6 and N7 and a ground voltage terminal, and receives a sense-amp enable signal SEN through a gate terminal.

The sense amplifier 600 is activated when the sense-amp enable signal SEN is in a high level, such that the sensing voltage SAI and the reference voltage VREF are compared with each other, and the result of the comparison is amplified.

Figure 10:
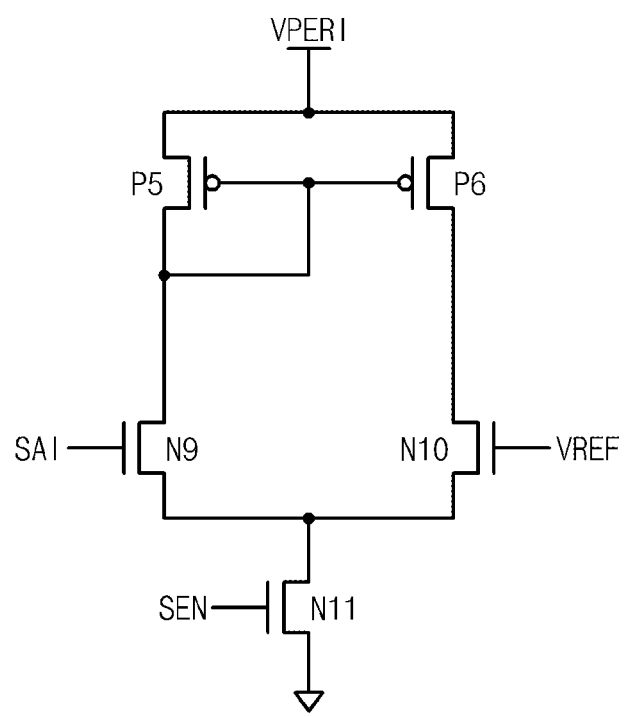
FIG. 10 is a detailed circuit diagram illustrating the sense amplifier shown in FIG. 4 according to another embodiment of the present invention.

FIG. 10 is a detailed circuit diagram illustrating the sense amplifier 600 shown in FIG. 4 according to another embodiment of the present invention.

Referring to FIG. 10, the sense amplifier 600 includes PMOS transistors P5 and P6 and a plurality of NMOS transistors N9~N11. In this case, a common gate terminal of the PMOS transistors P5 and P6 is connected to a drain terminal of the NMOS transistor N9 that is connected to a source terminal of the PMOS transistor P5.

In addition, the NMOS transistor N9 receives the sensing voltage SAI through its own gate terminal, and the NMOS transistor N10 receives the reference voltage VREF through its own gate terminal. The sensing voltage SAI and the reference voltage VREF are compared with each other, and the result of the comparison is amplified. The NMOS transistor N11 is connected between a common source terminal of the NMOS transistors N9 and N10 and a ground voltage terminal, and receives a sense-amp enable signal SEN through a gate terminal.

The sense amplifier 600 is activated when the sense-amp enable signal SEN is in a high level, such that the sensing voltage SAI and the reference voltage VREF are compared with each other and the result of the comparison is amplified.

As apparent from the above description, the above-mentioned embodiments of the present invention have the following characteristics.

First, the non-volatile memory device according to an embodiment of the present invention adjusts a sensing voltage level by feeding back an output signal of a current-voltage converter, such that a sensing margin is increased, whereas a sensing time is reduced.

Second, the non-volatile memory device according to an embodiment of the present invention can reduce the possibility of a failed read operation caused by the variation of offset conditions such as PVT (process, voltage, and temperature) and the like.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an exemplary embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A non-volatile memory device comprising:
   a cell array having a plurality of unit cells configured to store data;
   a current-voltage converter configured to convert a sensing current corresponding to data stored in a unit cell in the cell array into a sensing voltage, output the sensing voltage, receive a feedback input of the sensing voltage, and selectively provide a high voltage to an input terminal of the sensing current in response to the feedback input of the sensing voltage; and
   a sense amplifier configured to compare the sensing voltage with a reference voltage, and amplify a result of comparison.

2. The non-volatile memory device according to claim 1, wherein the current-voltage converter is configured to supply the high voltage to the input terminal of the sensing current when the data stored in the unit cell is high-resistance reset data so that the sensing voltage is pulled up to the high voltage.

3. The non-volatile memory device according to claim 1, wherein the current-voltage converter includes:
   a clamping unit configured to clamp a level of the sensing voltage in response to a clamping control signal;
   a driving circuit configured to drive the sensing voltage in response to a precharge signal and a current driving signal; and
   a feedback circuit configured to selectively supply the high voltage to the input terminal of the sensing current in response to the feedback input of the sensing voltage and the precharge signal.

4. The non-volatile memory device according to claim 3, wherein the clamping unit includes a transistor that is coupled to and disposed between an output terminal of the sensing voltage and the input terminal of the sensing current and receives the clamping control signal through a gate terminal.

5. The non-volatile memory device according to claim 3, wherein the driving circuit includes:
   a precharge unit configured to precharge the sensing voltage with the high voltage when the precharge signal is activated; and
   a current adjusting unit configured to convert the sensing current into the sensing voltage in response to the current driving signal.

6. The non-volatile memory device according to claim 3, wherein the feedback circuit is deactivated during a precharge operation.

7. The non-volatile memory device according to claim 3, wherein the feedback circuit includes:
   a first element configured to selectively provide the high voltage in response to the feedback input of the sensing voltage; and
   a second element configured to transmit an output voltage of the first element to the input terminal of the sensing current when the precharge signal is deactivated.

8. The non-volatile memory device according to claim 1, wherein the unit cell includes:
   a phase change resistor coupled to a bit line; and
   a diode element coupled to and disposed between the phase change resistor and a word line.

9. A non-volatile memory device comprising:
   a cell array including a plurality of unit cells to store data;
   a clamping unit configured to clamp a sensing current sensed from a unit cell in the cell array in response to a clamping control signal;
   a driving circuit configured to convert the sensing current into a sensing voltage in response to a precharge signal and a current driving signal; and
   a feedback circuit configured to adjust a level of the sensing current in response to the sensing voltage and the precharge signal.

10. The non-volatile memory device according to claim 9, wherein the level of the sensing current is adjusted when the data stored in the unit cell is high-resistance reset data so that the sensing voltage is pulled up to a high voltage.

11. The non-volatile memory device according to claim 9, further comprising:
   a sense amplifier configured to compare the sensing voltage with a predetermined reference voltage, and amplify the result of comparison.

12. The non-volatile memory device according to claim 11, further comprising a data input/output (I/O) unit configured to latch output data of the sense amplifier.

13. The non-volatile memory device according to claim 11, wherein the sense amplifier drives the sensing voltage with a voltage level used in a peripheral circuit.

14. The non-volatile memory device according to claim 9, wherein the clamping unit includes a transistor that is coupled to and disposed between an output terminal of the sensing voltage and an input terminal of the sensing current and receives the clamping control signal through a gate terminal.

15. The non-volatile memory device according to claim 9, wherein the driving circuit includes:
   a precharge unit configured to precharge the sensing voltage with a high voltage when the precharge signal is activated; and
   a current adjusting unit configured to convert the sensing current into the sensing voltage in response to the current driving signal.

16. The non-volatile memory device according to claim 9, wherein the feedback circuit is deactivated during a precharge operation.

17. The non-volatile memory device according to claim 9, wherein the feedback circuit includes:
   a first element configured to selectively provide a high voltage in response to the sensing voltage; and
   a second element configured to transmit an output voltage of the first element to an input terminal of the sensing current when the precharge signal is deactivated.

18. The non-volatile memory device according to claim 17, wherein the first element includes a first NMOS transistor whose drain terminal is coupled to a high voltage terminal.

19. The non-volatile memory device according to claim 17, wherein the second element includes a second NMOS transistor that is coupled to and disposed between the first element and the input terminal of the sensing current.

20. The non-volatile memory device according to claim 9, wherein the unit cell includes:
   a phase change resistor coupled to a bit line; and
   a diode element coupled to and disposed between the phase change resistor and a word line.

* * * * *